US 12,080,726 B2

(12) United States Patent
Tian et al.

(10) Patent No.: US 12,080,726 B2
(45) Date of Patent: Sep. 3, 2024

(54) GLOSSY DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Xueyan Tian, Beijing (CN); Jianchao Zhu, Beijing (CN); Libin Liu, Beijing (CN); Liangjian Li, Beijing (CN); Caiyu Qu, Beijing (CN); Dengyun Chen, Beijing (CN); Ximeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 885 days.

(21) Appl. No.: 17/265,742

(22) PCT Filed: Apr. 30, 2020

(86) PCT No.: PCT/CN2020/088361
§ 371 (c)(1),
(2) Date: Feb. 3, 2021

(87) PCT Pub. No.: WO2021/217600
PCT Pub. Date: Nov. 4, 2021

(65) Prior Publication Data
US 2022/0115417 A1    Apr. 14, 2022

(51) Int. Cl.
*H01L 27/12*     (2006.01)
*H01L 27/02*     (2006.01)
*H10K 59/131*    (2023.01)

(52) U.S. Cl.
CPC ...... *H01L 27/1259* (2013.01); *H01L 27/0292* (2013.01); *H01L 27/124* (2013.01); *H10K 59/131* (2023.02)

(58) Field of Classification Search
None
See application file for complete search history.

(56) References Cited

U.S. PATENT DOCUMENTS 11,024,695 B2 *  6/2021  Liu ................. H10K 59/122
2014/0140019 A1  5/2014  Park et al.
(Continued)

FOREIGN PATENT DOCUMENTS

CN      2693113 Y    4/2005
CN    106200153 A   12/2016
(Continued)

OTHER PUBLICATIONS

Extended European Search Report for Application No. 20897629.0-1020, dated Jun. 5, 2023, 7 Pages.

*Primary Examiner* — Nishath Yasmeen
(74) *Attorney, Agent, or Firm* — Brooks Kushman P.C.

(57) ABSTRACT

A glossy display panel, a manufacturing method thereof and a display device are provided. The glossy display panel includes a display area and a non-display area; wherein the non-display area includes a binding area, and the glossy display panel includes a first conductive pattern located on a base substrate and located in the binding area; a first insulating layer covering the first conductive pattern, wherein the first insulating layer is provided with a first via hole, and an orthographic projection of the first via hole onto the base substrate is located within an orthographic projection of the first conductive pattern onto the base substrate; a glossy reflection layer, wherein an orthographic projection of the glossy reflection layer onto the base substrate does not overlap with an orthographic projection of the binding area onto the base substrate; and a chip on film.

20 Claims, 3 Drawing Sheets

(56) References Cited

U.S. PATENT DOCUMENTS

| | | | |
|---|---|---|---|
| 2016/0254341 A1* | 9/2016 | Zhang | H10K 50/80 |
| | | | 257/40 |
| 2016/0308168 A1 | 10/2016 | Lee et al. | |
| 2017/0069808 A1 | 3/2017 | Kim et al. | |
| 2019/0036073 A1* | 1/2019 | Yu | G06F 3/0443 |
| 2019/0115400 A1 | 4/2019 | Park et al. | |
| 2019/0245024 A1 | 8/2019 | Lim et al. | |
| 2021/0210527 A1* | 7/2021 | Bai | H01L 27/124 |
| 2021/0232266 A1* | 7/2021 | Wu | G06F 3/0416 |
| 2022/0285406 A1* | 9/2022 | Wang | H01L 27/1244 |

FOREIGN PATENT DOCUMENTS

| | | |
|---|---|---|
| CN | 108649134 A | 10/2018 |
| CN | 109698160 A | 4/2019 |
| CN | 110767841 A | 2/2020 |
| CN | 110838509 A | 2/2020 |
| CN | 110931540 A | 3/2020 |
| CN | 210271564 U | 4/2020 |
| JP | 2018069007 A | 5/2018 |

\* cited by examiner

GLOSSY DISPLAY PANEL, MANUFACTURING METHOD THEREOF AND DISPLAY DEVICE

CROSS-REFERENCE TO RELATED APPLICATION

This application is the U.S. national phase of PCT Application No. PCT/CN2020/088361 filed on Apr. 30, 2020, which is incorporated herein by reference in its entirety.

TECHNICAL FIELD

The present disclosure relates to the field of display technology, and in particular to a glossy display substrate, a manufacturing method thereof and a display device.

BACKGROUND

A display substrate of a glossy display screen includes a display layer and a reflection layer that covers a light-exiting side of the display layer, so that the glossy display screen can realize not only functions of a common mirror, but also an image display function. Therefore, glossy display screens are widely used in vehicle-mounted rearview mirrors, makeup mirrors and other fields.

SUMMARY

A glossy display panel, a manufacturing method thereof and a display device are provided according to embodiments of the present disclosure.

In a first aspect, a glossy display panel is provided according to embodiments of the present disclosure. The glossy display panel includes a display area and a non-display area, wherein the non-display area includes a binding area, and the glossy display panel includes: a first conductive pattern that is located on a base substrate and located in the binding area; a first insulating layer covering the first conductive pattern, wherein the first insulating layer is provided with a first via hole, and an orthographic projection of the first via hole onto the base substrate is located within an orthographic projection of the first conductive pattern onto the base substrate; a glossy reflection layer located on a side of the first insulating layer distal to the base substrate, wherein an orthographic projection of the glossy reflection layer onto the base substrate does not overlap with an orthographic projection of the binding area onto the base substrate; and a chip on film (COF) electrically connected to the first conductive pattern through the first via hole.

Further, the glossy display panel includes: an anti-static pattern located between the base substrate and the first insulating layer, wherein an orthographic projection of the anti-static pattern onto the base substrate at least partially overlaps with an orthographic projection of the glossy reflection layer onto the base substrate; the first insulating layer is further provided with a second via hole, the glossy reflection layer is electrically connected to the anti-static pattern through the second via hole, and the second via hole is located outside the binding area.

Further, the glossy display panel includes a cathode, wherein the cathode is electrically connected to the anti-static pattern.

Further, the second via hole is located between the display area and the binding area.

Further, the glossy display panel includes a thin film transistor array layer located on the base substrate, wherein the first conductive pattern and a source-drain pattern of the thin film transistor array layer are arranged in a same layer and made of a same material.

Further, the glossy reflection layer is made of one or more materials of molybdenum, aluminum, titanium, and silver.

Further, the glossy display panel includes: a second conductive pattern located between the first conductive pattern and the base substrate; and a second insulating layer located between the second conductive pattern and the first conductive pattern, wherein the second insulating layer is provided with a third via hole, and the first conductive pattern is electrically connected to the second conductive pattern through the third via hole.

Further, the glossy display panel includes a thin film transistor array layer located on the base substrate, wherein a gate pattern in the thin film transistor array layer and the second conductive pattern are arranged in a same layer and made of a same material.

Further, an orthographic projection of the third via hole onto the base substrate is located within an orthographic projection of the first via hole onto the base substrate.

Further, the first insulating layer includes a planarization layer.

In a second aspect, a display device is further provided according to embodiments of the present disclosure, including the aforementioned glossy display panel.

In a third aspect, a method for manufacturing a glossy display substrate is further provided according to embodiments of the present disclosure. The method includes: providing a base substrate; forming a first conductive pattern in a binding area on the base substrate; forming a first insulating layer covering the first conductive pattern, wherein the first insulating layer is provided with a first via hole, and an orthographic projection of the first via hole onto the base substrate is located within an orthographic projection of the first conductive pattern onto the base substrate; forming a glossy reflection layer covering the first insulating layer and the first conductive pattern, wherein an orthographic projection of the glossy reflection layer onto the base substrate does not overlap with an orthographic projection of the binding area onto the base substrate; and forming a COF bound to the first conductive pattern in the binding area.

Further, prior to forming the first insulating layer covering the first conductive pattern, the method includes: forming an anti-static pattern on the base substrate. The forming the first insulating layer covering the first conductive pattern includes: forming the first insulating layer covering the first conductive pattern and the anti-static pattern, wherein the first conductive pattern and the anti-static pattern are insulated from each other, and the first insulating layer is further provided with a second via hole; wherein the second via hole is located outside the binding area, and an orthographic projection of the second via hole on the base substrate is located within an orthographic projection of the anti-static pattern onto the base substrate. The forming the glossy reflection layer covering the first insulating layer and the first conductive pattern includes: forming the glossy reflection layer covering the second via hole.

Further, the forming the first conductive pattern in the binding area of the base substrate includes: forming a source-drain pattern in a display area of the base substrate and forming the first conductive pattern in the binding area through a single patterning process.

Further, prior to the forming the first conductive pattern in the binding area of the base substrate, the method includes:

forming a second conductive pattern in the binding area of the base substrate; and forming a second insulating layer covering the second conductive pattern, wherein the second insulating layer is provided with a third via hole, and an orthographic projection of the third via hole onto the base substrate is located within an orthographic projection of the second conductive pattern onto the base substrate. The forming the first conductive pattern in the binding area of the base substrate includes: forming the first conductive pattern covering the second insulating layer and the second conductive pattern.

Further, the forming the second conductive pattern in the binding area of the base substrate includes: forming a gate pattern in the display area of the base substrate and forming the second conductive pattern in the binding area of the base substrate through a single patterning process.

DETAILED DESCRIPTION

Hereinafter, the technical solutions in embodiments of the present disclosure are described clearly and completely in conjunction with drawings in the embodiments of the present disclosure. Apparently, the described embodiments are merely a part of the embodiments of the present disclosure, rather than all of the embodiments. All other embodiments obtained by a person of ordinary skill in the art based on the described embodiments of the present disclosure without paying creative efforts shall fall within the scope of the present disclosure.

In the related art, subsequent to forming a first conductive pattern and a thin film encapsulation layer, when patterning a glossy reflection layer, the glossy reflection layer in a binding area is etched through a dry etching process. Nevertheless, the dry etching process is difficult to control, which will cause a phenomenon that the first conductive pattern under the glossy reflection layer is over-etched, destroying a normal shape of a film layer under the glossy reflection layer, and resulting in a problem of low production yield of the glossy display panel.

Regarding the aforementioned problem, a glossy display panel, a manufacturing method thereof and a display device are provided according to embodiments of the present disclosure, which can solve the problem of low production yield of the glossy display panel in the related art.

Figure 1:
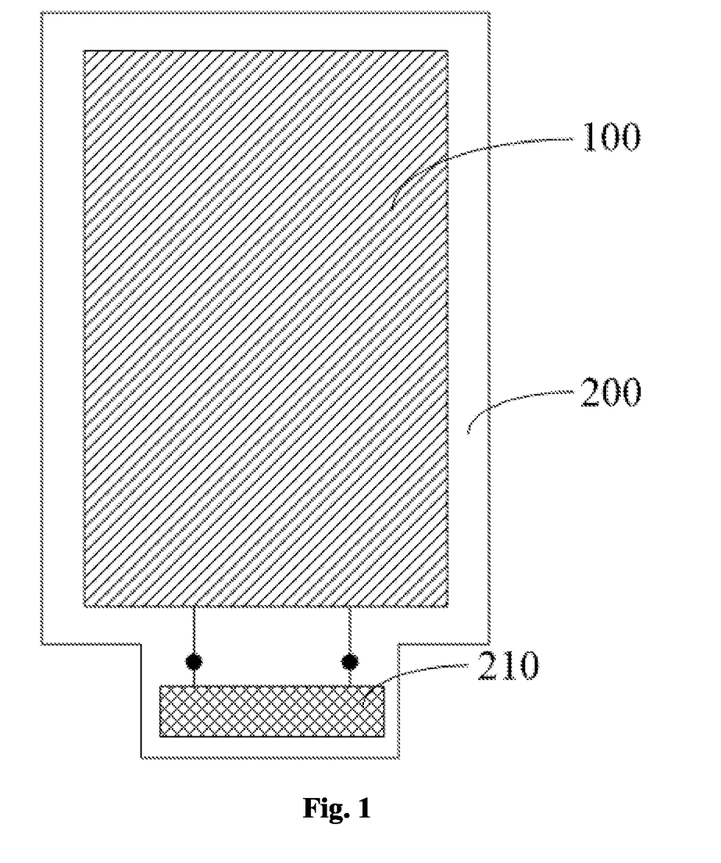
FIG. 1 is a schematic diagram of areas of a glossy display panel according to an embodiment of the present disclosure.
Figure 2:
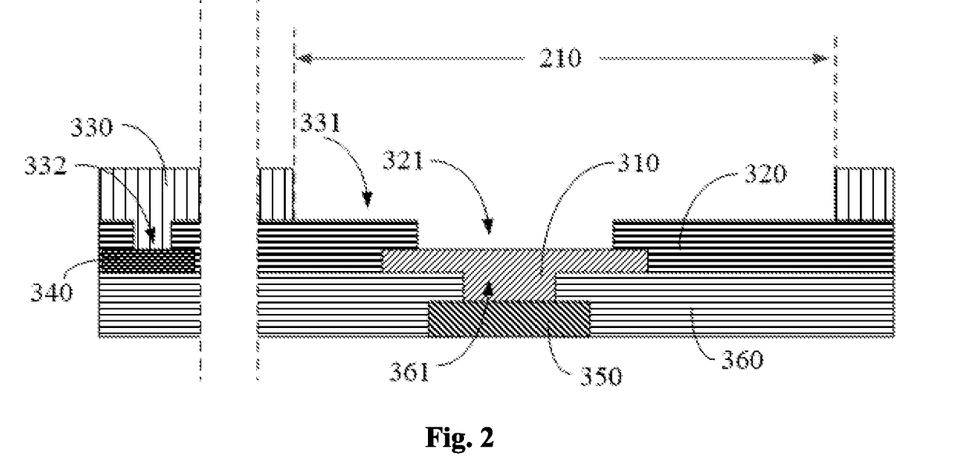
FIG. 2 is a partial cross-sectional view of a glossy display panel according to another embodiment of the present disclosure.

A glossy display panel is provided according to embodiments of the present disclosure, as shown in FIG. 1, the glossy display panel includes a display area 100 and a non-display area 200, wherein the non-display area 200 includes a binding area 210. The glossy display panel, as shown in FIG. 2, includes: a first conductive pattern 310 located on a base substrate and located in the binding area 210; a first insulating layer 320 covering the first conductive pattern 310, wherein the first insulating layer 320 is provided with a first via hole 321, and an orthographic projection of the first via hole 321 onto the base substrate is located within an orthographic projection of the first conductive pattern 310 onto the base substrate; a glossy reflection layer 330 located on a side of the first insulating layer 320 distal to the base substrate 330, wherein an orthographic projection of the glossy reflection layer 330 on the base substrate does not overlap with an orthographic projection of the binding area 210 on the base substrate; and a COF electrically connected to the first conductive pattern 310 through the first via hole 321.

In embodiments of the present disclosure, in a process of forming a glossy reflection layer by wet etching, a first conductive pattern is covered by a first insulating layer and a glossy reflection material, so that the first conductive pattern will not be etched by etchant, ensuring a shape and a reliability of the first conductive pattern, and improving a manufacturing yield of the glossy display panel. Therefore, a technical solution provided according to the present disclosure can prevent the first conductive pattern from being etched and improve the manufacturing yield of the glossy display panel.

The aforementioned base substrate may be a rigid substrate or a flexible substrate. In the case that the base substrate is a rigid base substrate, the base substrate may be a glass substrate or a quartz substrate; in the case that the base substrate is a flexible base substrate, the base substrate is a polyimide base substrate.

The aforementioned non-display area 200 is arranged to surround the display area 100, and a shape of the display area 100 may be rectangle, circle, etc., which is not limited here. The non-display area 200 receives an external electrical signal through the binding area 210, and transmits an electrical signal into the display area 100 in a form of wiring, so that a light-emitting device in the display area 100 emits a light corresponding to the electrical signal to display an image.

The aforementioned first conductive pattern 310 is located within the binding area 210 and can be used to transmit an electrical signal from the binding area 210 to the display area 100. The first conductive pattern 310 and a certain conductive pattern in the display area 100 may be formed through a patterning process, or can be independently formed in the non-display area 200, which is not limited here.

The aforementioned first insulating layer 320 may be an organic insulating layer or an inorganic insulating layer. An orthographic projection of the first via hole 321 on the first insulating layer 320 onto the base substrate is within an orthographic projection of the first conductive pattern 310 onto the base substrate, so that the first conductive pattern 310 can receive through the first via hole 321 electrical signals from a side of the first insulating layer 320 distal to the base substrate.

The first insulating layer 320 may be a planarization layer, which not only plays a role of insulation, but also improves a flatness of a surface of the first conductive pattern 310, facilitating a flatness of enabling a binding of the first conductive pattern 310 and the COF, and improving a reliability of binding.

Subsequent to forming an encapsulation film of the display substrate, the aforementioned glossy reflection layer 330 is formed, and is located on a side of the encapsulation film distal to the base substrate. The glossy reflection layer 330 can transmit a portion of light while reflecting another portion of the light, so that the user not only views the display screen, but also uses the glossy display device as a mirror.

The glossy reflection layer 330 may be located only within the display area, or may be located within both the display area 100 and the non-display area other than the binding area 210. For example: in an optional embodiment, subsequent to forming a glossy reflection material layer as an entire layer, an opening penetrating through the glossy reflection material layer is formed in the binding area to form the glossy reflection layer. For another example, in another optional embodiment, subsequent to forming the glossy reflection material layer as the entire layer, an opening penetrating through the glossy reflection material layer may be formed in the non-display area to form the glossy reflection layer.

It should be noted that, FIG. 2 is only a schematic illustration, and other functional film layers may also be included between the glossy reflection layer 330 and the first insulating layer 320, which is not limited here.

The aforementioned glossy reflection layer can be made of one or more materials of molybdenum (Mo), aluminum (Al), titanium (Ti), silver (Ag), and indium tin oxide (ITO). For example, the glossy reflection layer is of a Ti/Al/Ti structure or an ITO/Ag/ITO structure, or made of an aluminum alloy or a silver alloy.

The COF passes through the first via hole 321 and is electrically connected to the first conductive pattern 310, realizing signal transmissions in each wiring of the display substrate.

Further, as shown in FIG. 2, the glossy display panel includes: an anti-static pattern 340 located between the base substrate and the first insulating layer 320, wherein an orthographic projection of the anti-static pattern 340 onto the base substrate at least partially overlaps with an orthographic projection of the glossy reflection layer 330 onto the base substrate. The first insulating layer 320 is further provided with a second via hole 322, the glossy reflection layer 330 is electrically connected to the anti-static pattern 340 through the second via hole 322, and the second via hole is located outside the binding area.

The glossy reflection layer 330 can generate static electricity, and a conductive pattern is required to discharge through the glossy reflection layer 330 the static electricity on the glossy reflection layer 330. In the embodiment, the second via hole 322 is provided in the first insulating layer 320, such that the glossy reflection layer 330 can be electrically connected to the anti-static pattern 340, to form a static electricity discharge path for the glossy reflection layer 320.

The anti-static pattern 340 may be electrically connected to a conductive pattern where a low potential signal, such as a ground terminal is located, and it is not limited here. The anti-static pattern 340 can be provided in the same layer and is made of the same material as the first conductive pattern 310.

Due to a large number of electrical signals in the binding area 210, signal interference with static electricity is likely to occur. In the embodiment, the second via hole 322 may be arranged outside the binding area 210, such that the static electricity discharge path can be kept away from the binding area 210, and an extent of signal interference between static electricity and signals in the binding area can be reduced or even eliminated.

Figure 3:
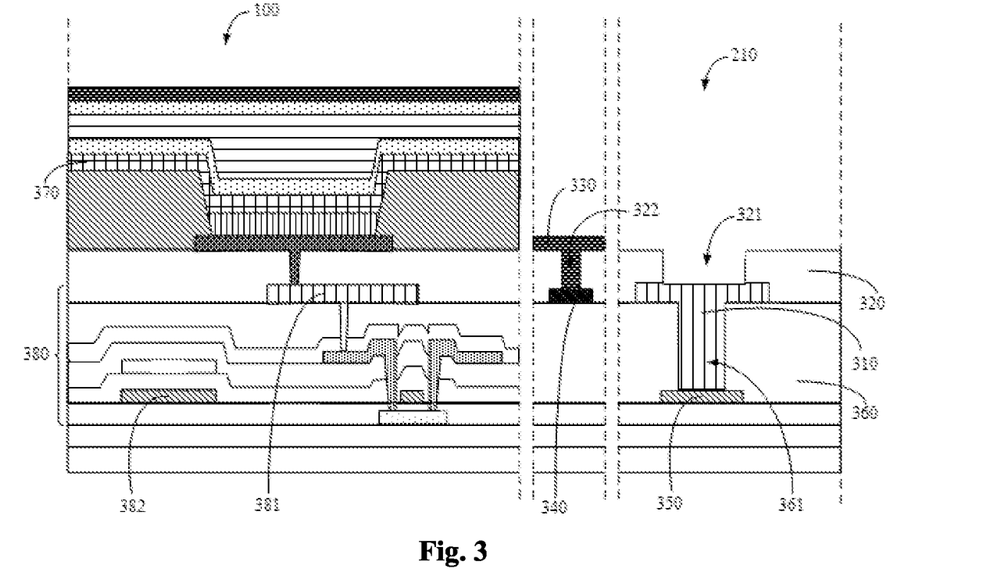
FIG. 3 is a cross-sectional view of a glossy display panel according to another embodiment of the present disclosure.

Further, as shown in FIG. 3, the glossy display panel includes: a cathode 370, wherein the cathode 370 is electrically connected to the anti-static pattern 340.

The glossy display panel further includes a cathode 370 that is arranged on the base substrate and covers the display area. A signal on the cathode 370 is a low potential signal, which can discharge static electricity generated by the glossy reflection layer 330.

The aforementioned cathode 370 may be formed subsequent to the first insulating layer 320. A hole is provided between the cathode and the anti-static pattern, such that a signal transmission path is formed, and thus the glossy reflection layer 330 may use the anti-static pattern 340 to discharge static electricity at the cathode 370.

The anti-static pattern 340 may be a part of the low potential power signal wiring connected to the cathode 370 in the display area 100, or may be an additional conductive pattern connected to the low potential power signal wiring, which is not limited here.

Further, the second via hole 322 is located between the display area 100 and the binding area 210.

The second via hole 322 may be provided between the display area 100 and the binding area 210, which can prevent static electricity from being close to the binding area and adversely affecting the signal transmission of the binding area, and can also avoid a problem of too many layers in the display area 100, to reduce the number of openings and improve manufacturing efficiency.

Further, as shown in FIG. 3, the glossy display panel includes a thin film transistor array layer 380 located on the base substrate, wherein the first conductive pattern 310 is provided in a same layer and is made of a same material as a source-drain pattern 381 of the thin film transistor array layer 380.

In the embodiment, the source-drain pattern 381 is formed in the display area 100 and the first conductive pattern 310 is formed in the binding area 200 simultaneously through a single patterning process, which can improve the manufacturing efficiency of the glossy display panel as compared to two separate manufacturing processes, and reduce manufacturing time.

Further, the glossy display panel includes: a second conductive pattern 350 located between the first conductive pattern 310 and the base substrate; and a second insulating layer 360 located between the second conductive pattern 350 and the first conductive pattern 310, wherein the second insulating layer 360 is provided with a third via hole 361, and the first conductive pattern 310 is electrically connected to the second conductive pattern 350 through the third via hole 361.

In the embodiment, the second conductive pattern 350 is electrically connected to the first conductive pattern 310. The first conductive pattern 310 writes an electrical signal into the second conductive pattern 350 to change a potential of the second conductive pattern 310, thereby changing a structure connected to the conductive pattern for operation.

The aforementioned second insulating layer 360 may be of a single layer structure or a multilayer structure. As shown in FIG. 3, the second insulating layer 360 may include at least one insulating layer in the thin film transistor array layer 380, that is, including at least one layer of a gate insulating (GI) layer, an interlayer dielectric (ILD) layer, an inorganic passivation (PVX) layer, or a planarization layer (PLN).

In the embodiment, the second conductive pattern 350 is electrically connected to the first conductive pattern 310 in the binding area 200, which can increase a thickness of binding wirings in the binding area and reduce a resistance of the binding wirings.

Further, the glossy display panel includes a thin film transistor array layer 380 located on the base substrate, wherein a gate pattern 382 in the thin film transistor array layer 380 is provided in a same layer and is made of a same material as the second conductive pattern 350.

In the embodiment, the gate pattern 382 is formed in the display area 100 and the second conductive pattern 350 is formed in the binding area 200 simultaneously through a single patterning process, which can improve the manufacturing efficiency of the glossy display panel as compared to two separate manufacturing processes, and reduce manufacturing time.

Further, an orthographic projection of the third via hole 361 on the base substrate is located within an orthographic projection of the first via hole 321 on the base substrate.

In the embodiment, an opening size of the first via hole 321 is larger than that of the third via hole 361, which is to increase a connection area between the COF and the first conductive pattern 310 and improve the reliability of the binding connection in the binding area.

An orthographic projection of the third via hole 361 on the base substrate is located within an orthographic projection of the first via hole 321 on the base substrate, which can reduce a signal transmission path in the binding area and improve signal transmission speed.

It should be noted that, in FIG. 2 and FIG. 3, in order to emphasize a technical content related to the present disclosure, a structure with two dashed lines and a blank in the middle is adopted to represent omitted irrelevant structures. The structure should not be regarded as an actual structure, nor should it be regarded as a limitation on the protection scope of the present disclosure.

A display device is further provided according to some embodiments of the present disclosure, including the aforementioned display panel.

The display device may be a display, a mobile phone, a tablet computer, a television, a wearable electronic device, a navigation display device, etc.

Figure 4:
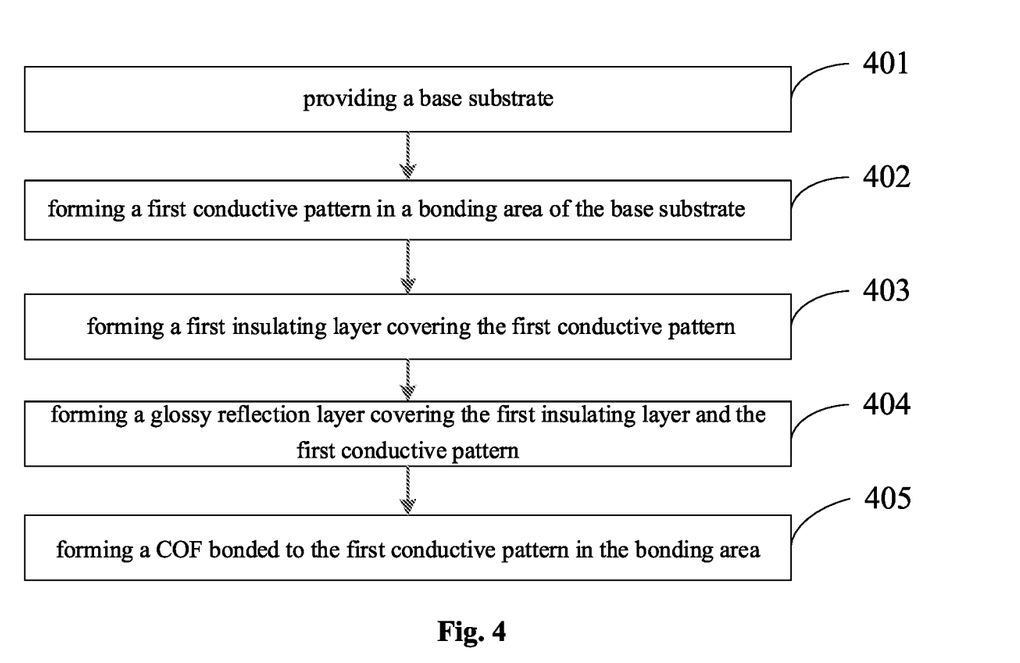
FIG. 4 is a flowchart of a manufacturing method of a glossy display panel according to an embodiment of the present disclosure.

A method for manufacturing a glossy display substrate is further provided according to embodiments of the present disclosure, as shown in FIG. 4, the method includes: a step 401 of providing a base substrate; a step 402 of forming a first conductive pattern in a binding area of the base substrate; a step 403 of forming a first insulating layer covering the first conductive pattern, wherein the first insulating layer is provided with a first via hole, and an orthographic projection of the first via hole onto the base substrate is located within an orthographic projection of the first conductive pattern onto the base substrate; a step 404 of forming a glossy reflection layer covering the first insulating layer and the first conductive pattern, wherein an orthographic projection of the glossy reflection layer onto the base substrate does not overlap with an orthographic projection of the binding area onto the base substrate; and a step 405 of forming a COF bound to the first conductive pattern in the binding area.

In embodiments of the present disclosure, in a process of forming a glossy reflection layer by wet etching, a first conductive pattern is covered by a first insulating layer and the glossy reflection material, so that the first conductive pattern will not be etched by an etchant, ensuring a shape and reliability of the first conductive pattern, and improving the production yield of the glossy display panel. Therefore, a technical solution according to the present disclosure can prevent the first conductive pattern from being etched and improve the manufacturing yield of the glossy display panel.

The aforementioned base substrate may be a rigid substrate or a flexible substrate. In the case that the base substrate is a rigid base substrate, the base substrate may be a glass substrate or a quartz substrate; in the case that the base substrate is a flexible base substrate, the base substrate is a polyimide base substrate.

As shown in FIG. 1, the aforementioned non-display area 200 is arranged to surround the display area 100, and a shape of the display area 100 may be rectangle, circle, etc., which is not limited here. The non-display area 200 receives an external electrical signal through the binding area 210, and transmits an electrical signal into the display area 100 in a form of wiring, so that a light-emitting device in the display area 100 emits a light corresponding to the electrical signal to display an image.

As shown in FIG. 2, the aforementioned first conductive pattern 310 is located within the binding area 210 and can be used to transmit electrical signals from the binding area 210 to the display area 100. The first conductive pattern 310 and a certain conductive pattern in the display area 100 may be formed through a patterning process, or can be independently formed in the non-display area 200, which is not limited here.

The aforementioned first insulating layer 320 may be an organic insulating layer or an inorganic insulating layer. An orthographic projection of the first via hole 321 on the first insulating layer 320 onto the base substrate is within an orthographic projection of the first conductive pattern 310 onto the base substrate, so that the first conductive pattern 310 can receive through the first via hole 321 electrical signals from a side of the first insulating layer 320 distal to the base substrate.

The first insulating layer 320 may be a planarization layer, which not only plays a role of insulation, but also improves a flatness of a surface of the first conductive pattern 310, facilitating a flatness of enabling a binding of the first conductive pattern 310 and the COF, and improving a reliability of binding.

Subsequent to forming an encapsulation film of the display substrate, the aforementioned glossy reflection layer 330 is formed, and is located on a side of the encapsulation film distal to the base substrate. The glossy reflection layer 330 can transmit a portion of light while reflecting another portion of the light, so that the user not only views the display screen, but also uses the glossy display device as a mirror.

The glossy reflection layer 330 may be located only within the display area, or may be located within both the display area 100 and the non-display area other than the binding area 210. For example: in an optional embodiment, subsequent to forming a glossy reflection material layer as an entire layer, an opening penetrating through the glossy reflection material layer is formed in the binding area to form the glossy reflection layer. For another example: in another optional embodiment, subsequent to forming the glossy reflection material layer as the entire layer, an opening penetrating through the glossy reflection material layer may be formed in the non-display area to form the glossy reflection layer.

It should be noted that, FIG. 2 is only a schematic illustration, and other functional film layers may also be included between the aforementioned glossy reflection layer 330 and the first insulating layer 320, which is not limited here.

The aforementioned glossy reflection layer can be made of one or more materials of molybdenum (Mo), aluminum (Al), titanium (Ti), silver (Ag), and indium tin oxide (ITO). For example, the glossy reflection layer is of a Ti/Al/Ti structure or an ITO/Ag/ITO structure, or made of an aluminum alloy or a silver alloy.

The COF passes through the first via hole 321 and is electrically connected to the first conductive pattern 310, realizing signal transmission in each wiring of the display substrate.

The aforementioned first conductive pattern 310 may be of the Ti/Al/Ti structure. When the glossy reflection layer 330 is also of the Ti/Al/Ti structure, there is a risk that the etchant used for subjecting the glossy reflection layer 330 to the wet etching process might also etch the first conductive pattern 310. In embodiments of the present disclosure, the first insulating layer 320 covers the first conductive pattern other than a part connected to the glossy reflection layer 330, which not only prevents the first conductive pattern 310 from being etched by the etchant, but also enables the film layer under the glossy reflection layer 330 to maintain a normal shape, which is beneficial to the planarization of the subsequently manufactured glossy reflection layer.

Further, prior to the forming the first insulating layer covering the first conductive pattern, the method includes: forming an anti-static pattern on the base substrate. The forming the first insulating layer covering the first conductive pattern comprises: forming a first insulating layer covering the first conductive pattern and the anti-static pattern, wherein the first conductive pattern and the anti-static pattern are insulated from each other, and the first insulating layer is further provided with a second via hole; wherein the second via hole is located outside the binding area, and an orthographic projection of the second via hole on the base substrate is located within an orthographic projection of the anti-static pattern onto the base substrate. The forming a glossy reflection layer covering the first insulating layer and the first conductive pattern comprises: forming a glossy reflection layer covering the second via hole.

The glossy reflection layer 330 can generate static electricity, and a conductive pattern is required to discharge through the glossy reflection layer 330 the static electricity on the glossy reflection layer 330. In the embodiment, the second via hole 322 is provided in the first insulating layer 320, such that the glossy reflection layer 330 can be electrically connected to the anti-static pattern 340, to form a static electricity discharge path for the glossy reflection layer 320.

The anti-static pattern 340 may be electrically connected to a conductive pattern where a low potential signal such as a ground terminal is located, and it is not limited here. The anti-static pattern 340 can be provided in the same layer and is made of the same material as the first conductive pattern 310.

Due to a large number of electrical signals in the binding area 210, signal interference with static electricity is likely to occur. In the embodiment, the second via hole 322 may be arranged outside the binding area 210, such that the static electricity discharge path can be kept away from the binding area 210, and an extent of signal interference between static electricity and signals in the binding area can be reduced or even eliminated.

The second via hole 322 may be provided between the display area 100 and the binding area 210, which can prevent static electricity from being close to the binding area and adversely affecting the signal transmission of the binding area, and can also avoid a problem of too many layers in the display area 100, to reduce the number of openings and improve manufacturing efficiency.

Further, the forming the first conductive pattern in the binding area of the base substrate includes: forming a source-drain patterns in a display area of the base substrate and forming the first conductive pattern in the binding area through a single patterning process.

In embodiments, the source-drain pattern 381 is formed in the display area 100 and the first conductive pattern 310 is formed in the binding area 200 simultaneously through a single patterning process, which can improve the manufacturing efficiency of the glossy display panel as compared to two separate manufacturing processes, and reduce manufacturing time.

Further, prior to the forming the first conductive pattern in the binding area of the base substrate, the method includes: forming a second conductive pattern in the binding area of the base substrate; and forming a second insulating layer covering the second conductive pattern, wherein the second insulating layer is provided with a third via hole, and an orthographic projection of the third via hole onto the base substrate is located within an orthographic projection of the second conductive pattern onto the base substrate. The forming the first conductive pattern in the binding area of the base substrate includes: forming the first conductive pattern covering the second insulating layer and the second conductive pattern.

In the embodiment, the second conductive pattern 350 is electrically connected to the first conductive pattern 310 in the binding area 200, which can increase a thickness of binding wirings in the binding area and reduce a resistance of the binding wirings.

An orthographic projection of the third via hole 361 onto the base substrate is located within an orthographic projection of the first via hole 321 onto the base substrate. The opening size of the first via hole 321 is larger than the third via hole 361, which can increase the connection area between the COF and the first conductive pattern 310, and improve the reliability of the binding connection in the binding area.

An orthographic projection of the third via hole 361 onto the base substrate is located within an orthographic projection of the first via hole 321 onto the base substrate, which can reduce a signal transmission path in the binding area and improve signal transmission speed.

Further, the forming the first conductive pattern in the binding area of the base substrate includes: forming a gate pattern in the display area of the base substrate and forming the second conductive pattern in the binding area of the base substrate through a single patterning process.

In the embodiment, the gate pattern 382 is formed in the display area 100 and the second conductive pattern 350 is formed in the binding area 200 simultaneously through a single patterning process, which can improve the manufacturing efficiency of the glossy display panel as compared to two separate manufacturing processes, and reduce manufacturing time.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Terms "up", "down", "left", "right", etc. are only used to indicate the relative position relationship. When an absolute position of the described object is changed, the relative position relationship might be changed accordingly.

It will be understood that when an element, such as a layer, film, area or substrate, is referred to as being "on" or "under" another element, it can be directly on or directly under the other element, or intervening elements may also be present.

The above are merely optional embodiments of the present disclosure. It should be noted that those of ordinary skill in the art may make further modifications and improvements without departing from the principle of the present disclosure, and these modifications and improvements shall also fall within the scope of the present disclosure.

What is claimed is:

1. A glossy display panel, comprising: a display area and a non-display area; wherein the non-display area comprises a binding area, and the glossy display panel comprises:
    a first conductive pattern that is located on a base substrate and located within the binding area;
    a first insulating layer covering the first conductive pattern, wherein the first insulating layer is provided with a first via hole, and an orthographic projection of the first via hole onto the base substrate is located within an orthographic projection of the first conductive pattern onto the base substrate;
    a glossy reflection layer located on a side of the first insulating layer distal to the base substrate, wherein an orthographic projection of the glossy reflection layer onto the base substrate does not overlap with an orthographic projection of the binding area onto the base substrate; and
    a chip on film (COF) electrically connected to the first conductive pattern through the first via hole.

2. The glossy display panel according to claim 1, further comprising an anti-static pattern located between the base substrate and the first insulating layer, wherein an orthographic projection of the anti-static pattern onto the base substrate at least partially overlaps with an orthographic projection of the glossy reflection layer onto the base substrate;
    the first insulating layer is further provided with a second via hole, the glossy reflection layer is electrically connected to the anti-static pattern through the second via hole, and the second via hole is located outside the binding area.

3. The glossy display panel according to claim 2, further comprising a cathode, wherein the cathode is electrically connected to the anti-static pattern.

4. The glossy display panel according to claim 2, wherein the second via hole is located between the display area and the binding area.

5. The glossy display panel according to claim 1, further comprising a thin film transistor array layer located on the base substrate, wherein the first conductive pattern and a source-drain pattern of the thin film transistor array layer are arranged in a same layer and made of a same material.

6. The glossy display panel according to claim 1, wherein the glossy reflection layer is made of one or more materials of molybdenum, aluminum, titanium, and silver.

7. The glossy display panel according to claim 1, further comprising:
    a second conductive pattern located between the first conductive pattern and the base substrate; and
    a second insulating layer located between the second conductive pattern and the first conductive pattern, wherein the second insulating layer is provided with a third via hole, and the first conductive pattern is electrically connected to the second conductive pattern through the third via hole.

8. The glossy display panel according to claim 7, comprising a thin film transistor array layer located on the base substrate, wherein the second conductive pattern and a gate pattern in the thin film transistor array layer are arranged in a same layer and made of a Same material.

9. The glossy display panel according to claim 8, wherein an orthographic projection of the third via hole onto the base substrate is located within an orthographic projection of the first via hole onto the base substrate.

10. The glossy display panel according to claim 1, wherein the first insulating layer comprises a planarization layer.

11. A display device, comprising the glossy display panel according to claim 1.

12. A method for manufacturing a glossy display substrate, comprising:
    providing a base substrate;
    forming a first conductive pattern in a binding area of the base substrate;
    forming a first insulating layer covering the first conductive pattern, wherein the first insulating layer is provided with a first via hole, and an orthographic projection of the first via hole onto the base substrate is located within an orthographic projection of the first conductive pattern onto the base substrate;
    forming a glossy reflection layer covering the first insulating layer and the first conductive pattern, wherein an orthographic projection of the glossy reflection layer onto the base substrate does not overlap with an orthographic projection of the binding area onto the base substrate; and
    forming in the binding area a COF bound to the first conductive pattern.

13. The method according to claim 12, wherein prior to forming the first insulating layer covering the first conductive pattern, the method further comprises:
    forming an anti-static pattern on the base substrate;
    the forming the first insulating layer covering the first conductive pattern comprises:
    forming the first insulating layer covering the first conductive pattern and the anti-static pattern, wherein the first conductive pattern and the anti-static pattern are insulated from each other, and the first insulating layer is further provided with a second via hole; wherein the second via hole is located outside the binding area, and an orthographic projection of the second via hole on the base substrate is located within an orthographic projection of the anti-static pattern onto the base substrate;
    the forming the glossy reflection layer covering the first insulating layer and the first conductive pattern comprises:
    forming the glossy reflection layer covering the second via hole.

14. The method according to claim 12, wherein the forming the first conductive pattern in the binding area of the base substrate comprises:
    forming a source-drain pattern in a display area of the base substrate and forming the first conductive pattern in the binding area through a single patterning process.

15. The method according to claim 12, wherein prior to forming the first conductive pattern in the binding area of the base substrate, the method further comprises:
    forming a second conductive pattern in the binding area of the base substrate; and forming a second insulating layer covering the second conductive pattern, wherein the second insulating layer is provided with a third via hole, and an orthographic projection of the third via hole onto the base substrate is located within an orthographic projection of the second conductive pattern onto the base substrate;

the forming the first conductive pattern in the binding area of the base substrate comprises:

forming the first conductive pattern covering the second insulating layer and the second conductive pattern.

16. The method according to claim 15, wherein the forming the second conductive pattern in the binding area of the base substrate comprises:

forming a gate pattern in the display area of the base substrate and forming the second conductive pattern in the binding area of the base substrate through a single patterning process.

17. The display device according to claim 11, wherein the glossy display panel further comprises an anti-static pattern located between the base substrate and the first insulating layer, wherein an orthographic projection of the anti-static pattern onto the base substrate at least partially overlaps with an orthographic projection of the glossy reflection layer onto the base substrate;

the first insulating layer is further provided with a second via hole, the glossy reflection layer is electrically connected to the anti-static pattern through the second via hole, and the second via hole is located outside the binding area.

18. The display device according to claim 17, wherein the glossy display panel further comprises a cathode, wherein the cathode is electrically connected to the anti-static pattern.

19. The display device according to claim 17, wherein the second via hole is located between the display area and the binding area.

20. The display device according to claim 11, wherein the glossy display panel further comprises a thin film transistor array layer located on the base substrate, wherein the first conductive pattern and a source-drain pattern of the thin film transistor array layer are arranged in a same layer and made of a same material.

* * * * *